(12) United States Patent
Nurser

(10) Patent No.: US 6,584,024 B2
(45) Date of Patent: Jun. 24, 2003

(54) MEMORY TESTING

(75) Inventor: Henry Nurser, Bristol (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 0 days.

(21) Appl. No.: 09/906,391

(22) Filed: Jul. 16, 2001

(65) Prior Publication Data
US 2002/0044491 A1 Apr. 18, 2002

(30) Foreign Application Priority Data
Jul. 18, 2000 (GB) .............................................. 0017614

(51) Int. Cl.[7] .............................. G11C 7/00; G11C 29/00
(52) U.S. Cl. .................... 365/201; 365/194; 365/203
(58) Field of Search ................ 365/201, 194, 365/203

(56) References Cited
U.S. PATENT DOCUMENTS

| | | | |
|---|---|---|---|
| 3,995,215 A | 11/1976 | Chu et al. | |
| 4,715,034 A | * 12/1987 | Jacobson | 365/201 |
| 5,471,482 A | * 11/1995 | Byers et al. | 365/194 |
| 5,995,426 A | 11/1999 | Cowles et al. | |
| 6,061,285 A | * 5/2000 | Tsukikawa | 365/201 |
| 6,108,252 A | 8/2000 | Park | |
| 6,185,141 B1 | * 2/2001 | Hoshita et al. | 365/194 |

FOREIGN PATENT DOCUMENTS
EP        0 357 516 A2    3/1990

OTHER PUBLICATIONS

Standard Search Report performed in the European Patent Office for United Kingdom application No. 106825.

* cited by examiner

Primary Examiner—Richard Elms
Assistant Examiner—Jung H. Hur
(74) Attorney, Agent, or Firm—Wolf, Greenfield & Sacks, P.C.; James H. Morris; Robert A. Skrivanek, Jr.

(57) ABSTRACT

A method and apparatus for determining the write-recovery of an embedded memory by performing successive pseudo-write operations followed by read operations until a "just-valid" result is achieved. The read operations may include addressing memory cells storing a logic value opposite that of memory cells coupled to the bit lines in the pseudo-write operations.

16 Claims, 2 Drawing Sheets

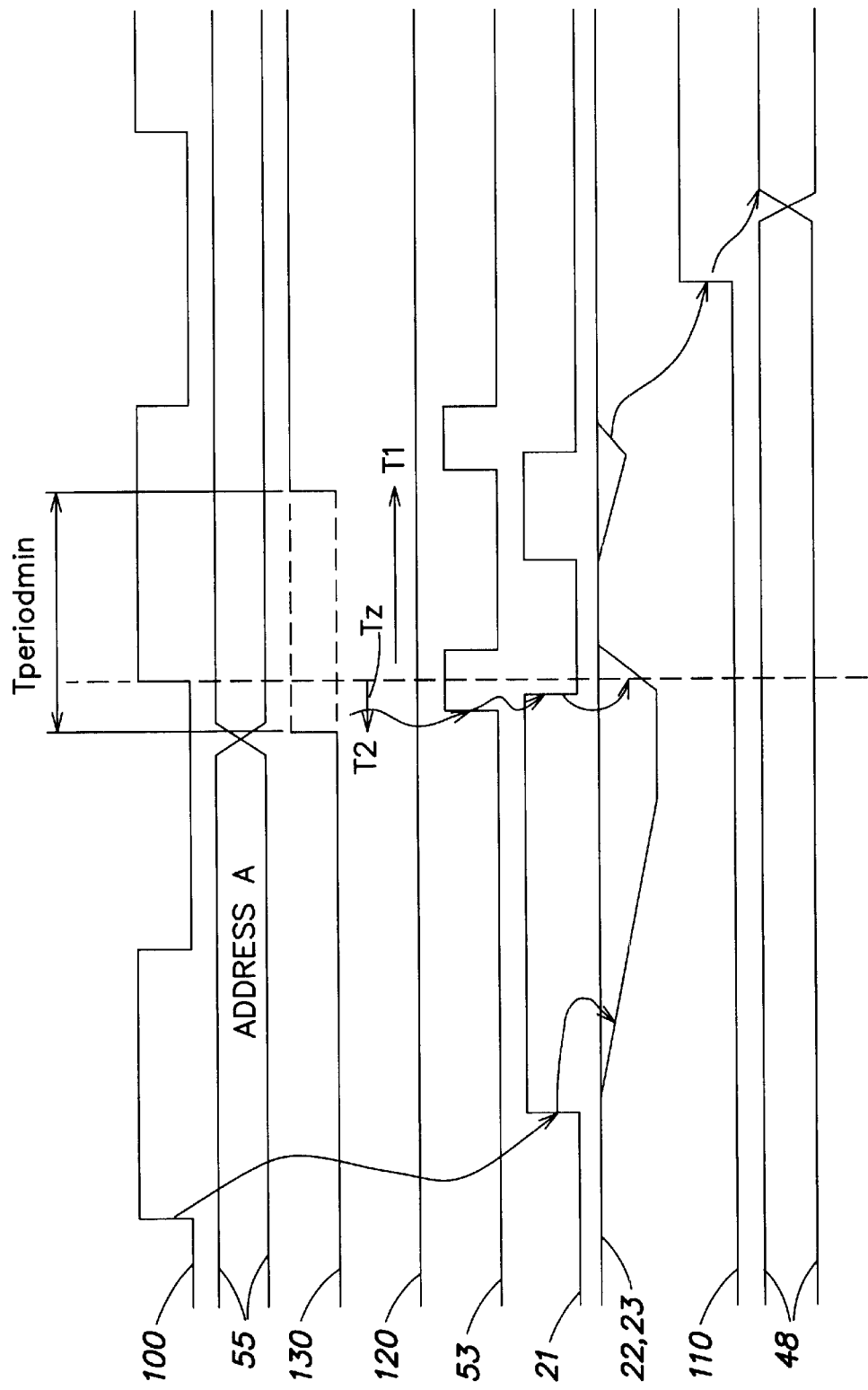

MEMORY TESTING

FIELD OF THE INVENTION

The present invention relates to a method and apparatus for determining the write recovery time of a semiconductor memory on an integrated circuit.

BACKGROUND TO THE INVENTION

A number of problems occur in testing embedded semiconductor memories, foremost among which is the problem of determining when the relevant events occur at the memory itself. This is due to the fact that the components of the memory are not directly accessible.

One particularly difficult performance indicator for a memory, especially a RAM, is the maximum operating frequency (Fmax). Typically, Fmax is limited by the ability of a memory to perform a write followed by a read. This is because during a write operation the bit lines are set to a maximum differential, for example Vcc and O for a logic 1, and O and Vcc for a logic O. For the next read to occur reliably, the precharge and equalization period must be long enough for both the bit lines to return substantially to Vcc. The time needed for a read following a write is referred to as the "write recovery" time.

Measuring the write recovery time is difficult because direct and delay-free access to the relevant circuit nodes is not available. Such paths as are available have indeterminate delays which may be substantial by comparison with this write recovery time.

It is accordingly an object of the present invention to provide an apparatus and method for determining the-write recovery time of a semiconductor memory on an integrated circuit.

SUMMARY OF THE INVENTION

According to a first aspect of the present invention there is provided a method of measuring the write recovery time of an embedded memory having an externally accessible first pad for providing an activation signal to equalization and precharge circuitry to thereby cause equalization and precharging of bit lines of said memory, the method comprising: addressing a memory cell storing a first logic level whereby said memory cell causes bit lines connected thereto to separate in potential; applying a precharge signal to said pad at a time such that while said bit lines are at substantially a maximum differential, said equalization and precharge circuitry is activated; thereafter sensing the potential on bit lines connected to a cell storing a second logic level, opposite said first logic level; and determining the minimum time necessary after application of said precharge signal to said pad before said sensing operation achieves a valid result.

Preferably said equalization and precharge circuitry further comprises sense amplifier circuitry activated by said activation signal for performing said sensing operation, and said memory has an externally accessible clock pad for receiving a clock signal for starting a read operation, said read operation comprising said sensing operation, and circuitry connected to receive said clock pulse, said circuitry being operable during said read operation to provide said activation signal a fixed time after said clock signal, wherein said determining step comprises measuring the minimum time-spacing after application of said precharge signal before a clock signal gives rise to a valid result in its read operation, and establishing said fixed time.

Advantageously said fixed time is established as the minimum duration from applying a clock signal to said clock pad until a said control signal is applied in response to which the sense amplifier circuitry produces a valid output.

According to a second aspect of the invention there is provided a method of determining the write recovery performance of a memory, the memory having at least one pair of complementary bit lines, plural memory cells for coupling to said bit lines, and sense and precharge circuitry responsive to an activation signal for sensing the logic value of memory cells coupled to said bit lines and for precharging said bit lines, the method comprising: a pseudo-write step comprising coupling first memory cells storing a first logic value to said bit lines whereby said bit lines separate in potential, and after said bit lines have separated to a substantially maximum separation, applying said activation signal to said sense and precharge circuitry: a reading step comprising addressing second memory cells storing a second logic value opposite to said first value, whereby said second memory cells are coupled to said bit lines and whereby said activation signal is supplied to said sense and precharge circuitry at a fixed delay after said addressing; determining the minimum time-spacing between the instant of applying said activating signal in said pseudo-write step and the instant of said addressing in said reading step for which the output of said sense and precharge circuitry remains valid.

Preferably said memory further comprises address latch circuitry, a self-timing path and a two-input multiplexer having a control input, the address latch circuitry having a clock input node connected to a first external clock pad, the self-timing path having an input and an output, said input being responsive to a clock edge at said first external clock pad and said output, in use, providing said activation signal in response thereto after said fixed time to one input of said two-input multiplexer, the other input of the two input multiplexer being connected to a second external pad and the control input of the two-input multiplexer being coupled to a third external pad, wherein: in said pseudo-write step, said coupling step comprises providing a transition from a first to a second voltage level, to said first external clock pad whereby said first memory cells are addressed and thereby coupled to said bit lines, and whereby a transition from said first to said second level is provided at said output of said self-timing path after said fixed delay, and in said pseudo-write step, said applying step comprises maintaining an input of said first level at said second external pad, providing a control signal at said third external pad to cause said two-input multiplexer to connect said input of said first level at said second pad to said sense and precharge circuitry to maintain said sense and precharge circuitry inactive beyond the occurrence of said transition to said second level at said output of said self-timing path, and causing a change in said control signal whereby said two-input multiplexer switches and connects the second level output from the self-timing path to activate said sense and precharge circuitry.

Advantageously said memory further has comprises address latch circuitry, a self-timing path and a two-input multiplexer having a control input, the address latch circuitry having a clock input node connected to a first external clock pad, the self-timing path having an input and an output, said input being responsive to a clock edge at said first external clock pad and said output, in use, providing said activation signal in response thereto after said fixed time to one input of said two-input multiplexer, the other input of the two input multiplexer being connected to a second external pad and the control input of the two-input multiplexer being coupled to a third external pad, wherein: in said pseudo-write step, said coupling step comprises providing a transition from a first to a second voltage level, to said first external clock pad whereby said first memory cells are addressed and thereby coupled to said bit lines, and whereby a transition from said first to said second level is provided at said output of said self-timing path after said fixed delay, and in said pseudo-write step, said applying step comprises maintaining an input of said first level at said second external pad, providing a control signal at said third external pad to cause said two-input multiplexer to connect said input of said first level at said second pad to said sense and precharge circuitry to maintain said sense and precharge circuitry inactive beyond the occurrence of said transition to said second level at said output of said self-timing path, and causing a change in said control signal whereby said two-input multiplexer switches and connects the second level output from the self-timing path to activate said sense and precharge circuitry.

Conveniently the method further comprises selecting said predetermined period as an access time of said memory.

Advantageously said selecting said predetermined period as an access time of said memory.

Conveniently the method further comprises determining said fixed time and adding said fixed time to said period to provide a measure of said write recovery performance.

Advantageously the step of determining said fixed time comprises establishing said time as the minimum duration between providing a clock transition to said first external clock pad and application of a said control signal to said third external pad, which duration results in a valid output from said output latch circuitry.

According to a further aspect of the invention there is provided a device for determining the write recovery time of a memory, the memory having at least one pair of complementary bit lines, plural memory cells for coupling to said bit lines, and sense and precharge circuitry responsive to an activation signal for sensing the logic value of memory cells coupled to said bit lines and for precharging said bit lines, address latch circuitry having a clock input node connected to a first external clock pad, a self-timing path having an input and an output, said self-timing path input being responsive to a clock edge at said first external clock pad and said self-timing path output during a read cycle of said memory providing said activation signal in response to said clock edge after a fixed time, the memory further comprising first cells storing a first logic value and second cells storing a second logic value opposite said first logic value; the device comprising a two-input multiplexer having a control input, one input of said two-input multiplexer, being connected to the output of said self-timing path, the other input of the two input multiplexer being connected to a second external pad and the control input of the two-input multiplexer being coupled to a third external pad; address circuitry for selecting said first memory cells; testing circuitry for providing said clock edge to said first external clock pad to couple said first memory cells to said bit lines whereby said bit lines separate in potential, for maintaining a control signal on said third external pad to couple said other input of the two-input multiplexer to said sense and precharge circuitry and for providing a fixed potential on said second external pad whereby said sense and precharge circuitry remains inactivated and after said bit lines have separated to substantially a maximum separation, for applying a change in control signal level causing said control signal to switch said multiplexer to thereby apply said activating signal to said sense and precharge circuitry, whereby said bit lines are precharged; whereby after said precharge commences, said address circuitry is operable to address said second memory cells, said testing circuitry is operable to apply a said clock edge to said first external clock pad whereby said second memory cells are coupled to said bit lines and to supply a control signal to said third external pad to connect said self-timing path output via said two-input multiplexer to said sense and precharge circuitry; wherein said write recovery time is determined as the minimum period between said application of a change in control signal level and the instant at which an edge applied at said third external pad would coincide with the appearance of a transition in said self-timing path output when said edge reached said sense and precharge circuitry.

An embodiment of the present invention will now be described by way of example only with reference to the accompanying drawings.

BRIEF DESCRIPTION OF THE DRAWINGS

FIG. 2 shows various waveforms exhibited by the device of FIG. 1 during the method of the invention.

In the figures like reference numerals refer to like parts.

DESCRIPTION OF THE PREFERRED EMBODIMENTS

Figure 1:
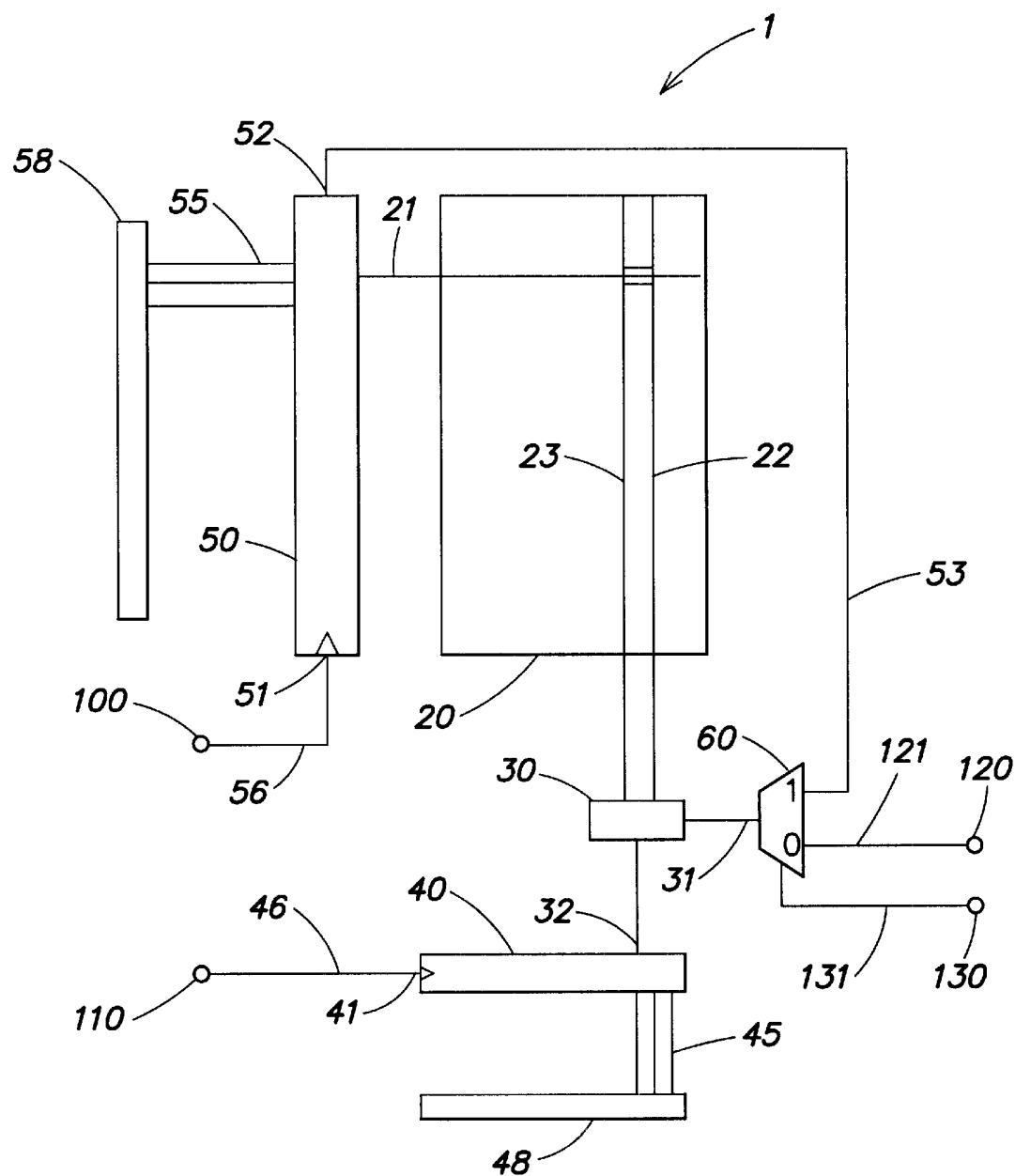
FIG. 1 shows a partial block diagram of a memory circuit suitable for the method of the present invention.

Referring first to FIG. 1 an integrated circuit 1 has a semiconductor memory 20 consisting of a plurality of wordlines 21 forming the rows of the memory array and a plurality of pairs 22, 23 of bitlines, forming the columns of the semiconductor array. Each pair of bitlines is connected to a respective sense amplifier 30, the sense amplifiers having a common clock input terminal 31. The output 32 of the sense amplifiers is connected to an output latch circuit 40 whose output is in turn connected via a path 45 to plural output pads 48. The wordlines 21 are connected to an address latch 50 which is connected to input pads 58 via an address path 55. The address latch has a clock input terminal 51 which is connected via a first path 56 to a first clock pad 100. The output latch 40 has a clock input terminal 41 is connected via a second said path 46 to a second clock input terminal 110.

The address latch 50 has a clock output terminal 52 which is connected via a delay-producing third path 53 to a first input of a two-input multiplexer 60, whose output is the common clock input 31 to the sense amplifiers. The third path 53 will be referred to hereinafter as the self-timing path.

The second input to the two-input multiplexer 60 is provided from a third clock pad 120 via a fourth path 121. The control input for two-input multiplexer 60 is provided from a fourth pad 130 via a fifth path 131. Each of the paths 121, 131 provides a respective delay, due to the path length.

The method of the invention has three stages. In the first stage, a first clock input edge passing from logic zero to logic 1 is applied to the first clock pad 100 which causes the address latch 50 to activate a wordline 21. This actuation occurs after the application of the clock edge, due at least in part to the delay of the first path 56. In response to the wordline actuation, as is known to those skilled in the art, the bit lines 22, 23 begin to separate in potential. During the first stage, the fourth pad 130 is provided with a constant logic 1 which causes the multiplexer 60 to connect the sense amplifier clock inputs to receive the first clock edge via the self-timing third path 53. The self-timing path length is selected so that the sense amplifier will not be clocked until the bit lines have separated sufficiently for the logic state stored by the associated memory cells to be accurately sensed. At an arbitrary time after the sense amplifier has switched, a second clock pulse is applied to the second pad 110 and this gives rise to an internal clock pulse at the clock terminal 41 of the output latch, which transfers the sensed data to the output pads 48.

This operation is repeated with the second clock pulse 110 being applied at ever closer times to the time of application of the first clock edge to the first pad 100 until the output sensed at the output pads 48 no longer accurately reflects what is stored in the memory. Then the timing of the second clock pulse is retarded slightly until the sensing is just successful.

The outcome of the first stage is a time separation between application of the second clock pulse with respect to the first clock edge. This separation represents the access time for the memory together with an inaccuracy due to the delays of the first and second delay-producing paths 46 and 56. However for the purposes of the present method, these inaccuracies are not significant because the absolute access time is not required.

For the second stage, the relative timing of the first and second clock pulses is kept at that determined during the first stage.

For this the third pad 120 is supplied with a logic zero, and the timing of a transition from logic 0 to logic 1 of the fourth pad 130 is varied with reference to the timing of the first clock edge. By this means, the two-input multiplexer 60 initially passes zero and then the logic 1 from the internal clock edge over the path 53: the timing of the logic 1 is varied by the variation in timing of the transition at the fourth pad 130. A timing of the transition at the fourth clock pad 130 which produces the just successful result is sought. For this to occur, the transition applied to the third clock pulse pad 120, after passing along the fifth path 131 and through the multiplexer 60 arrives at the clock terminals 31 of the sense amplifiers at the same instant as the internal clock pulse over the self-timing path 53. Once again the absolute time of providing this transition is not needed in the present method, only the time relative to the first clock edge. A clock pulse source providing this pulse is then fixed with respect to the first clock edge.

The third stage of the method will now be described with reference to FIG. 2. To begin with, the third clock pad 120 is held at logic zero with the input to the fourth pad 130 being at logic 0 so that the sense amplifiers 30 will not be clocked. An address A is selected which has a known logic value and the first clock pulse is applied to the first pad 100 so that the voltage on bitline 22 begins to fall, i.e the bitline's begin to separate. After a time sufficient to allow the bitlines to fully separate, ie. at a time when the bitline state is the same as for a write, the fourth pad 130 is switched to logic 1 and the time of switching noted. The time is noted as the period before the next first clock edge is applied to the first pad 100. The switching causes the logic 1 which has by now appeared along the self-timing path 53 to clock the sense amplifiers, thereby causing the sense amplifiers 30 to start precharge and equalization of the bitlines 22,23. Then, in a second phase, a conventional read takes place, with this time the memory cell selected by the address being one which has the opposite logic state to that selected in the first phase. This read takes place with the multiplexer 60 connected to pass the internal clock pulse via line 53 and the output state at the pad 48 is noted.

If the result is correct—ie. a correct analysis at the output pads 48 occurs—then the time T2 is sufficient for the bitlines to have been precharged to Vcc before the next read.

The third stage is repeated with ever shorter time periods Tz, ie. with the instant of switching the sense amplifiers back to precharge being ever closer to the next read transition until a "just-faulty" result is found. This then allows the write recovery time Tperiodmin to be implied, as being equal to the time determined in the second stage plus the time T2 of the third stage.

What is claimed is:

1. A method of measuring the write recovery time of an embedded memory having an externally accessible first pad for providing an activation signal to equalization and precharge circuitry to thereby cause equalization and precharging of bit lines of said memory, the method comprising:

addressing a memory cell storing a first logic level whereby said memory cell causes a first pair of bit lines connected thereto to separate in potential;

applying a precharge signal to said first pad at a time such that while said first pair of bit lines are at substantially a maximum differential, said equalization and precharge circuitry is activated;

thereafter sensing the potential on a second pair of bit lines connected to a cell storing a second logic level, opposite said first logic level; and determining the minimum time necessary after application of said precharge signal to said first pad before said sensing operation achieves a valid result.

2. The method of claim 1, wherein said equalization and precharge circuitry further comprises sense amplifier circuitry activated by said activation signal for performing said sensing operation, and said memory has an externally accessible clock pad for receiving a clock signal for starting a read operation, said read operation comprising said sensing operation, and circuitry connected to receive said clock signal, said circuitry being operable during said read operation to provide said activation signal a fixed time after said clock signal, wherein said determining step comprises:

measuring the minimum time-spacing after application of said precharge signal before said clock signal gives rise to a valid result in its read operation, and establishing said fixed time.

3. The method of claim 2 wherein said fixed time is established as the minimum duration from applying a clock signal to said clock pad until said activation signal is applied in response to which the sense amplifier circuitry produces a valid output.

4. A method of determining the write recovery performance of a memory, the memory having at least one pair of complementary bit lines, plural memory cells for coupling to said bit lines, and sense and precharge circuitry responsive to an activation signal for sensing the logic value of memory cells coupled to said bit lines and for precharging said bit lines, the method comprising:

a pseudo-write step comprising coupling first memory cells storing a first logic value to said bit lines whereby said bit lines separate in potential and after said bit lines have separated to a substantially maximum separation, applying said activation signal to said sense and precharge circuitry;

a reading step comprising addressing second memory cells storing a second logic value opposite to said first value, whereby said second memory cells are coupled to said bit lines and whereby said activation signal is supplied to said sense and precharge circuitry at a fixed delay after said addressing; and determining the minimum time-spacing between the instant of applying said activation signal in said pseudo-write step and the instant of said addressing in said reading step for which the output of said sense and precharge circuitry remains valid.

5. The method of claim 4 wherein said memory further comprises address latch circuitry, a self-timing path and a two-input multiplexer having a control input, the address latch circuitry having a clock input node connected to a first external clock pad, the self-timing path having an input and an output, said input being responsive to a clock edge at said first external clock pad and said output, in use, providing said activation signal in response thereto after said fixed delay to one input of said two-input multiplexer, the other input of the two input multiplexer being connected to a second external pad and the control input of the two-input multiplexer being coupled to a third external pad, wherein:

in said pseudo-write step, said coupling step comprises providing a transition from a first to a second voltage level, to said first external clock pad whereby said first memory cells are addressed and thereby coupled to said bit lines, and whereby a transition from said first to said second level is provided at said output of said self-timing path after said fixed delay, and in said pseudo-write step, said applying step comprises maintaining an input of said first level at said second external pad, providing a control signal at said third external pad to cause said two-input multiplexer to connect said input of said first level at said second pad to said sense and precharge circuitry to maintain said sense and precharge circuitry inactive beyond the occurrence of said transition to said second level at said output of said self-timing path, and causing a change in said control signal whereby said two-input multiplexer switches and connects the second level output from the self-timing path to activate said sense and precharge circuitry.

6. The method of claim 4 wherein said memory further has output latch circuitry having an input, an output and a clock node, said output latch circuitry input being connected to said output of said sense and precharge circuitry, said output latch circuitry output being connected to an output pad, and said clock node being coupled to a fourth external pad, the method further comprising supplying an output latch enabling signal to said fourth external pad after a predetermined period from said clock transition, thereby latching an output state of said sense and precharge circuitry.

7. The method of claim 6, further comprising a step of selecting said predetermined period as an access time of said memory.

8. The method of claim 7 wherein said selecting step comprises providing successive clock transitions to successively address memory cells whereby said activation signal is applied to said sense and precharge circuitry to provide an output and determining as said access time, the minimum duration from one of said clock transitions before an output latch enabling signal that gives rise to a valid output.

9. The method of claim 4 and further comprising determining said fixed delay and adding said fixed delay to said minimum time-spacing to provide a measure of said write recovery performance.

10. The method of claim 9 wherein said step of determining said fixed delay comprises establishing said fixed delay as the minimum duration between providing a clock transition to said first external clock pad and application of a control signal to a third external pad, which duration results in a valid output from said output latch circuitry.

11. A device for determining the write recovery time of a memory, the memory having at least one pair of complementary bit lines, plural memory cells for coupling to said bit lines, and sense and precharge circuitry responsive to an activation signal for sensing the logic value of memory cells coupled to said bit lines and for precharging said bit lines, address latch circuitry having a clock input node connected to a first external clock pad, a self-timing path having an input and an output, said self-timing path input being responsive to a clock edge at said first external clock pad and said self-timing path output during a read cycle of said memory providing said activation signal in response to said clock edge after a fixed time, the memory further comprising first cells storing a first logic value and second cells storing a second logic value opposite said first logic value; the device comprising:

a two-input multiplexer having a control input, one input of said two-input multiplexer, being connected to the output of said self-timing path, the other input of the two input multiplexer being connected to a second external pad and the control input of the two-input multiplexer being coupled to a third external pad;

address circuitry for selecting said first memory cells;

testing circuitry for providing said clock edge to said first external clock pad to couple said first memory cells to said bit lines whereby said bit lines separate in potential, for maintaining a control signal on said third external pad to couple said other input of the two-input multiplexer to said sense and precharge circuitry and for providing a fixed potential on said second external pad whereby said sense and precharge circuitry remains inactivated and after said bit lines have separated to substantially a maximum separation, for applying a change in control signal level causing said control signal to switch said multiplexer to thereby apply said activation signal to said sense and precharge circuitry, whereby said bit lines are precharged;

whereby after said precharge commences, said address circuitry is operable to address said second memory cells, said testing circuitry is operable to apply said clock edge to said first external clock pad whereby said second memory cells are coupled to said bit lines and to supply a control signal to said third external pad to connect said self-timing path output via said two-input multiplexer to said sense and precharge circuitry;

wherein said write recovery time is determined as the minimum period between said application of a change in control signal level and the instant at which an edge applied at said third external pad would coincide with the appearance of a transition in said self-timing path output when said edge reached said sense and precharge circuitry.

12. A method of determining the write recovery performance of a memory, the memory having at least one pair of complementary bit lines, plural memory cells for coupling to said bit lines, and sense and precharge circuitry responsive to an activation signal for sensing the logic value of memory cells coupled to said bit lines and for precharging said bit lines, wherein said memory further comprises address latch circuitry, a self-timing path and a two-input multiplexer having a control input, the address latch circuitry having a clock input node connected to a first external clock pad, the self-timing path having an input and an output, said input being responsive to a clock edge at said first external clock pad and said output, in use, providing said activation signal in response thereto after a fixed delay to one input of said two-input multiplexer, the other input of the two input multiplexer being connected to a second external pad and the control input of the two-input multiplexer being coupled to a third external pad, wherein said memory further has output latch circuitry having an input, an output and a clock node, said output latch circuitry input being connected to said output of said sense and precharge circuitry, said output latch circuitry output being connected to an output pad, and said clock node being coupled to a fourth external pad, the method comprising:

- a pseudo-write step comprising coupling first memory cells storing a first logic value to said bit lines whereby said bit lines separate in potential, and after said bit lines have separated to a substantially maximum separation, applying said activation signal to said sense and precharge circuitry, wherein said coupling step comprises providing a transition from a first to a second voltage level to said first external clock pad whereby said first memory cells are addressed and thereby coupled to said bit lines, and whereby a transition from said first to said second level is provided at said output of said self-timing path after said fixed delay, and in said pseudo-write step, said applying step comprises maintaining an input of said first level at said second external pad, providing a control signal at said third external pad to cause said two-input multiplexer to connect said input of said first level at said second pad to said sense and precharge circuitry to maintain said sense and precharge circuitry inactive beyond the occurrence of said transition to said second level at said output of said self-timing path, and causing a change in said control signal whereby said two-input multiplexer switches and connects the second level output from the self-timing path to activate said sense and precharge circuitry;
- a reading step comprising addressing second memory cells storing a second logic value opposite to said first value, whereby said second memory cells are coupled to said bit lines and whereby said activation signal is supplied to said sense and precharge circuitry at the fixed delay after said addressing;
- determining the minimum time-spacing between the instant of applying said activation signal in said pseudo-write step and the instant of said addressing in said reading step for which the output of said sense and precharge circuitry remains valid; and
- supplying an output latch enabling signal to said fourth external pad after a predetermined period from said clock transition, thereby latching an output state of said sense and precharge circuitry.

13. The method of claim 12, further comprising a step of selecting said predetermined period as an access time of said memory.

14. The method of claim 13, wherein said selecting step comprises providing successive clock transitions to successively address memory cells whereby said activation signal is applied to said sense and precharge circuitry to provide an output and determining as said access time, the minimum duration from one of said clock transitions before an output latch enabling signal that gives rise to a valid output.

15. The method of claim 13 further comprising a step of determining said fixed delay and adding said fixed delay to said minimum time-spacing to provide a measure of said write recovery performance.

16. The method of claim 15 wherein said step of determining said fixed delay comprises establishing said fixed delay as the minimum duration between providing a clock transition to said first external clock pad and application of a control signal to a third external pad, which duration results in a valid output from said output latch circuitry.

* * * * *